United States Patent [19]
Yamamoto et al.

[11] Patent Number: 5,811,843
[45] Date of Patent: Sep. 22, 1998

[54] FIELD EFFECT TRANSISTOR

[75] Inventors: Yoshitsugu Yamamoto; Norio Hayafuji, both of Tokyo, Japan

[73] Assignee: Mitsubishi Denki Kabushiki Kaisha, Tokyo, Japan

[21] Appl. No.: 805,363

[22] Filed: Feb. 24, 1997

[30] Foreign Application Priority Data

Oct. 17, 1996 [JP] Japan .................................. 8-274592

[51] Int. Cl.⁶ .................................................. H01L 29/778
[52] U.S. Cl. ........................................ 257/194; 257/631
[58] Field of Search .................................. 257/194, 200, 257/192, 631

[56] References Cited

U.S. PATENT DOCUMENTS

| | | | |
|---|---|---|---|
| 4,828,935 | 5/1989 | Jonker et al. | 257/631 |
| 5,352,909 | 10/1994 | Hori | 257/194 |
| 5,682,045 | 10/1997 | Hayafuji et al. | 257/192 |
| 5,686,740 | 11/1997 | Hida | 257/192 |
| 5,689,125 | 11/1997 | Vaccaro et al. | 257/200 |

FOREIGN PATENT DOCUMENTS

| | | |
|---|---|---|
| 4245444 | 9/1992 | Japan . |
| 883902 | 3/1996 | Japan . |

OTHER PUBLICATIONS

Yamamoto et al., "Donor Passivation in n–AlInAs Layers . . . ", Journal of Electronics Materials, vol. 25, No. 4, 1996, pp. 685–690.

Fujita et al., "Novel HEMT Structures Using A Strained InGaP . . . " Extented Abstracts of 5th Int'l Conf. on Indium Phosphide and Related Materials (1993) pp. 497–500.

Hayafuji et al., "Thermal stability of AlInAs/GaInAs/InP heterostructures", Applied Physics Letters, vol. 66, No. 7, pp. 863–865, Feb. 1995.

Hayafuji et al., "Fluorine Passivation Of AlInAs/InGaAs/InP System—Material Dependence —", Technical Report of IEICE, ED–95–108, Oct. 1995, pp. 35–40.

*Primary Examiner*—John F. Guay
*Attorney, Agent, or Firm*—Leydig, Voit & Mayer

[57] ABSTRACT

A field effect transistor includes a semi-insulating III-V compound semiconductor substrate; a channel layer disposed on the substrate; an n type electron supply layer disposed on the channel layer and comprising a mixed crystalline compound semiconductor layer including AlAs; an n type ohmic contact layer disposed on the electron supply layer; source and drain electrodes disposed on the ohmic contact layer; an opening in a region between the source and drain electrodes penetrating the ohmic contact layer; a gate electrode disposed in the opening and making a Schotty contact; and a surface protection film of a semiconductor material free of Al, In, and As, covering the opening except where the gate electrode is present. Fluorine is prevented from getting into the electron supply layer with no increase in transconductance or source resistance by providing a layer between the source and a channel, and between the gate and the channel.

17 Claims, 6 Drawing Sheets vacuum annealing regrowth after vacuum annealing

FIELD EFFECT TRANSISTOR

FIELD OF THE INVENTION

The present invention relates to a field effect transistor and a fabrication method thereof and, more particularly, to a field effect transistor such as a high electron mobility transistor comprising a mixed crystal semiconductor layer including n type AlAs and InAs as an electron supply layer and a fabrication method thereof.

BACKGROUND OF THE INVENTION

FIG. 6 is a cross-sectional view illustrating a structure of a prior art high electron mobility transistor (hereinafter referred to as an HEMT). In the figure, reference numeral 1 designates a semi-insulating InP substrate, numeral 2 designates an undoped (hereinafter referred to as i-) AlInAs buffer layer about 2500 Å thickness, numeral 3 designates an i-InGaAs channel layer about 500 Å thick, numeral 4 designates an i-AlInAs spacer layer about 20 Å thick, numeral 5 designates an n type (hereinafter referred to as n-) AlInAs electron supply layer about 100 Å thick with dopant impurities such as Si in a concentration of about $4 \times 10^{18}$ cm$^{-3}$ and numeral 6 designates an i-AlInAs Schottky contact layer about 200 Å thick. The spacer layer 4 and the Schottky contact layer 6 may be omitted. Numeral 7 designates an n-InGaAs ohmic contact layer about 500 Å thick with dopant impurities such as Si in a concentration of about $4 \times 10^{18}$ cm$^{-3}$, numeral 8 designates a source electrode comprising AuGe/Ni/Au or the like, numeral 9 designates a drain electrode comprising AuGe/Ni/Au or the like, numeral 10 designates a gate electrode comprising Ti/Al/Mo or the like, numeral 11 designates a dielectric protection film made of a dielectric material such as SiON, and numeral 13 designates two-dimensional electron gases in the upper portion of the channel layer 3.

A description is given of a fabrication method. Initially, the semi-insulating InP substrate 1 is prepared. On the semi-insulating InP substrate 1, the undoped AlInAs buffer layer 2, the i-InGaAs channel layer 3, the i-AlInAs spacer layer 4, the n-AlInAs electron supply layer 5, the i-AlInAs Schottky contact layer 6 and the n-InGaAs ohmic contact layer 7 are epitaxially and successively grown. Next, the source and drain electrodes 8 and 9 are formed on the ohmic contact layer 7 to make ohmic contacts.

Thereafter, a region between the source and drain electrodes 8 and 9 of the ohmic contact layer 7 is etched using a resist (not shown) as a mask to form an opening where the Schottky contact layer 6 is exposed in the bottom surface. After removal of the resist, again, a resist is formed to cover the opening. A region of the resist spaced equally from the source and drain electrodes 8 and 9 is patterned. A material of the gate electrode is deposited over the entire surface on the substrate 1. The gate electrode material on the resist as well as the resist is lifted off. The gate electrode 10 is formed in Schottky contact with the Schottky contact layer 6. Further, a dielectric protection film is formed by evaporation to cover a semiconductor layer exposed in the surface completing an HEMT shown in FIG. 6.

A description is given of an operation. Electrons generated from the dopant impurities in the electron supply layer 5 move to the channel layer 3 and gather in the upper portion thereof, where a two-dimensional electron gas is formed. The two-dimensional electron gas serves as a channel, for conduction of current between the source and drain electrodes 8 and 9. At this time an electron concentration of the two-dimensional electron gas varies in accordance with a gate voltage applied to the gate electrode 10, thereby controlling source to drain current. In this HEMT, since the electrons and the dopant impurities are isolated spatially and there are no dopant impurities obstructing the movement of electrons in a portion where electrons are present, the electrons have high electron mobility. Thus, the prior art AlInAs/InGaAs HEMT is formed on the InP substrate and has a structure with n-AlInAs in the electron supply layer and InGaAs in the channel layer. The HEMT has high electron transport properties due to material characteristics thereof. As a result, superior device properties are obtained.

However, in the HEMT with such a conventional structure, reliability of device properties degrades with a lapse of time. Especially, properties are significantly deteriorated in a current test at a high temperature, an accelerated lift test. As is explained in Journal of Electronic Material Vol. 25, No. 4, pp 685–690, deterioration is caused by fluorine coming from the surface upon heat treatment and deactivating donor impurities in the n-AlInAs electron supply layer. Since the n-AlInAs has poor heat resistance, carrier concentration is reduced to 90% at 300° C. and reduced to 30% at 450° C. upon heat treatment, for example. With respect to this problem, the result of a careful search for various III-V compound semiconductor material is described in ED95-108, pp 35–40. According to this reference, donor deactivation phenomena caused by fluorine invasion occurs significantly in materials including AlAs as well as InAs. Therefore, such deterioration of the HEMT is caused by the fact that fluorine attached to the surface of the AlInAs layer exposed to the atmosphere diffuses into the layer due to heat and deactivates the donors of the electron supply layer 5 when forming an opening for providing the gate electrode 10 in the ohmic contact layer 7, or when forming a gate recess.

On the other hand, an Extended Abstracts of 5th International Conference on Indium Phosphide and Related Materials (1993) pp. 497–500 (hereinafter referred to as reference 1) discloses the possibility of inhibiting fluorine invasion by placing a material which does not include either of AlAs and InAs on a surface layer side rather than on the AlInAs electron supply layer side. According to this disclosure, heat resistance is increased by successively growing materials such as InP or InGaP except for AlInAs as a protection film against fluorine invasion on the AlInAs layer so that the AlInAs is not exposed.

FIG. 7 is a cross-sectional view illustrating a structure of another prior art field effect transistor described in the reference 1, comprising a protection film preventing fluorine invasion into layers other than the AlInAs layer. In the figure, the same reference numerals as in FIG. 6 designate the same or corresponding parts. Numeral 12 designates a protection film preventing fluorine invasion, including n-InP or n-InGaP about 50 Å thick.

In the method of fabricating the HEMT shown in FIG. 6, this prior art HEMT is obtained by adding the process of growing epitaxially a protection film 12 preventing fluorine invasion to the process of growing epitaxially the Schottky contact layer 6 on the substrate 1. Since the protection film 12 preventing fluorine invasion is not a mixed crystal semiconductor layer including AlAs and InAs, it can prevent fluorine invasion. In addition, since the protection film 12 is successively grown on the Schottky contact layer 6, the surface of the Schottky contact layer 6 is not exposed to the atmosphere, whereby fluorine is prevented from getting into the AlInAs Schottky contact layer 6. Consequently, fluorine is prevented from getting into the n-AlInAs electron supply layer 5.

However, in the prior art HEMT comprising the protection film 12 preventing fluorine invasion, according to the Journal of Electronic Material Vol. 25, No. 4, pp 685–690, the protection film 12 must be about 20 nm or more thick so that it fully serves as a protection film preventing fluorine invasion.

Generally, a parameter used as an indication of properties of an HEMT device is transconductance gm, which is represented by the following equation.

$$\frac{1}{g_m} = R_s + \sqrt{\frac{dL_g}{2\epsilon\mu d_{sat}}} + \frac{d}{\epsilon v_{sp}}$$

Rs: source resistance
$\mu$: channel mobility
d: distance between a gate and a channel
$Id_{sat}$: drain saturation current
$\epsilon$: dielectric constant of an electron supply layer
$V_{sp}$: saturation peak speed of electrons
Lg: gate length According to this equation, in the HEMT, the smaller the distance between the gate electrode and the channel is and the smaller the source resistance Rs is, the more preferable device properties are obtained. Since the prior art HEMT in FIG. 7 comprises a protection film preventing fluorine invasion and 20 nm or more thick, the distance between the gate electrode and the channel and the source resistance Rs are significantly increased. Consequently, good device properties are not obtained.

To avoid the above-mentioned problem, a method of fabricating an HEMT is disclosed in Japanese Published Patent Application No. Hei 8-83902 (hereinafter referred to as a reference 2). As in the method of fabricating the HEMT shown in FIG. 6, in this method, a semi-insulating InP substrate 1 is prepared. On the semi-insulating InP substrate 1, an i-AlInAs buffer layer 2, an i-InGaAs channel layer 3, an i-AlInAs spacer layer 4, an n-AlInAs electron supply layer 5, an i-AlInAs Schottky contact layer 6 and an n-InGaAs ohmic contact layer 7 are epitaxially and successively grown. Source and drain electrodes 8 and 9 are formed on the ohmic contact layer 7. An opening is formed in the ohmic contact layer 7 to expose the i-AlInAs Schottky contact layer 6. After formation of a gate electrode 10 on the exposed i-AlInAs Schottky contact layer 6, vacuum annealing of the entire substrate 1 is performed to remove fluorine from the surface of the i-AlInAs Schottky contact layer 6 exposed in the opening. Then, a protection film 11 comprising a dielectric is formed on the exposed semiconductor layer on the substrate 1 without exposing the surface of the Schottky contact layer 6 exposed in the opening to the atmosphere, completing an HEMT having the same structure as described in the HEMT as shown in FIG. 6. As described in the reference 2, vacuum annealing can remove fluorine form the mixed crystal semiconductor layer including AlAs and InAs. Therefore, in this HEMT, fluorine on the surface of the AlInAs Schottky contact layer 6 is removed. In addition, the dielectric protection film 11 is provided so that no fluorine attaches to the surface. As a result, fluorine is prevented from getting into the n type AlInAs electron supply layer 5.

However, since SiON or SiN is generally used as a material of the dielectric protection film and plasma CVD is used in the fabrication process, the surface of the AlInAs Schottky contact layer 6 may be damaged when exposed to the plasma. This damage forms a surface level, resulting in an increase in leakage current, inferior gate breakdown voltage and drifting in device properties. As a result, device properties are deteriorated.

In order to avoid the problem due to the plasma, plasma CVD is employed at relatively low deposition temperatures of 300° C. or less. In this the effect of the plasma is suppressed but the quality of the dielectric film deteriorates. Therefore it is difficult to prevent fluorine invasion from the atmosphere by the dielectric protection film.

Also, when fluorine invasion is prevented merely with means of the dielectric protection film, the protection film the surface of the AlInAs Schottky contact layer 6 must have some thickness. However, since it is difficult to selectively form the dielectric protection film only on the AlInAs Schottky contact layer 6, only a portion on the Schottky contact layer 6 cannot be thickened, resulting in formation of a thick dielectric protection film over the surface of the substrate 1. This thick dielectric protection film increases stresses applied to the substrate 1 by the protection film, causing the substrate 1 to be bent. This causes an unstable fabrication process and peeling of the film. Consequently, an HEMT of good quality cannot be obtained.

SUMMARY OF THE INVENTION

It is an object of the present invention to provide a field effect transistor with improved reliability without deteriorating device properties and a fabrication method thereof.

Other objects and advantages of the present invention will become apparent from the detailed description given hereinafter. It should be understood, however, that the detailed description and specific embodiment are given by way of illustration only, since various changes and modifications within the scope of the invention will become apparent to those skilled in the art from this detailed description.

According to a first aspect of the present invention, a field effect transistor comprises a semi-insulating III-V group compound semiconductor substrate; a channel layer disposed on the substrate; an electron supply layer disposed on the channel layer and comprising a mixed crystal compound semiconductor layer including AlAs and InAs having n type impurities; an ohmic contact layer disposed on the electron supply layer and including the n type impurities at a high concentration; source and drain electrodes disposed on the ohmic contact layer to have an ohmic contact; an opening formed in a region between the source and drain electrodes of the ohmic contact layer and having a depth larger than the thickness of the ohmic contact layer; a gate electrode disposed on a region in the bottom surface of the opening to have a Schottky contact; and a surface protection film made of a semiconductor material which does not contain all of Al, In and As, disposed over the entire surface except for a region where the gate electrode is formed in the bottom surface of the opening. Therefore, fluorine is prevented from getting into the electron supply layer with no increase in a transconductance gm or a source resistance Rs by providing a layer between a source and a channel, and between a gate and a channel. Further, the surface protection film of good quality is formed using a selective growth method without adversely affecting a device. As a result, a field effect transistor with improved reliability is obtained with no deterioration of device properties.

According to a second aspect of the present invention, in the field effect transistor, a gate recess is provided in the bottom surface of the opening and the gate electrode is disposed on the bottom surface of the gate recess. As a result, a field effect transistor with improved reliability is obtained with no deterioration of device properties.

According to a third aspect of the present invention, a field effect transistor comprises a semi-insulating III-V group compound semiconductor substrate; a channel layer disposed on the substrate; an electron supply layer disposed on the channel layer and comprising a mixed crystal compound semiconductor layer including AlAs and InAs having n type impurities; an ohmic contact layer disposed on the electron supply layer and including the n type impurities at a high concentration; source and drain electrodes disposed on the ohmic contact layer to have an ohmic contact; an opening formed in a region between the source and drain electrodes of the ohmic contact layer and having a depth larger than the thickness of the ohmic contact layer; a surface protection film made of a semiconductor material which does not contain all of Al, In and As, disposed over the entire bottom surface of the opening; and a gate electrode disposed on a region of the opening to have a Schottky contact. Therefore, fluorine is prevented from getting into the electron supply layer with no increase in a source resistance Rs by providing a layer between a source and a channel. Also, since the gate electrode is formed after selective growth of the surface protection film, the degree of freedom in designing of the gate electrode material is increased. Further, the surface protection film of good quality is formed using a selective growth method without adversely affecting the device. As a result, a field effect transistor with improved reliability is obtained with no deterioration of device properties.

According to a fourth aspect of the present invention, in the field effect transistor, the III-V group compound semiconductor substrate is used as an InP substrate, so that device properties are not deteriorated, resulting in a field effect transistor with improved reliability.

According to a fifth aspect of the present invention, a method of fabricating a field effect transistor comprises the steps of preparing a semi-insulating III-V group semiconductor substrate; successively forming a channel layer, an electron supply layer comprising a mixed crystal compound semiconductor layer including AlAs and InAs having n type impurities, and an ohmic contact layer including n type impurities at a high concentration on the semi-insulating III-V group semiconductor substrate by crystal growth; forming source and drain electrodes on the ohmic contact layer to have an ohmic contact; forming an opening having a depth larger than the thickness of the ohmic contact layer in a region between the source and drain electrodes of the ohmic contact layer; forming a gate electrode on a region in the bottom surface of the opening to have a Schottky contact; annealing the bottom surface of the opening in vacuum; and subsequently to the annealing step, forming a surface protection film made of a semiconductor material which does not contain all of Al, In and As over the entire surface except for a region where the gate electrode is formed in the bottom surface of the opening, with the bottom surface of the opening not exposed to the atmosphere. Therefore, fluorine is prevented from getting into the electron supply layer with no increase in a transconductance gm and a source resistance Rs by providing a layer between a source and a channel, and between a gate and a channel. Further, the surface protection film of good quality is formed using a selective growth method without adversely affecting device properties. As a result, a field effect transistor with improved reliability is obtained with no deterioration of device properties.

According to a sixth aspect of the present invention, a method of fabricating the field effect transistor comprises the step of forming a gate recess in the bottom surface of the opening after formation of the opening in the ohmic contact layer, the gate electrode being formed on the bottom surface of the gate recess. As a result, a field effect transistor with improved reliability is obtained with no deterioration of device properties.

According to a seventh aspect of the present invention, in a method of fabricating the field effect transistor, the III-V group compound semiconductor substrate is used as an InP substrate, so that device properties are not deteriorated, resulting in a field effect transistor with improved reliability.

DETAILED DESCRIPTION OF THE PREFERRED EMBODIMENTS

[Embodiment 1]

Figure 1:
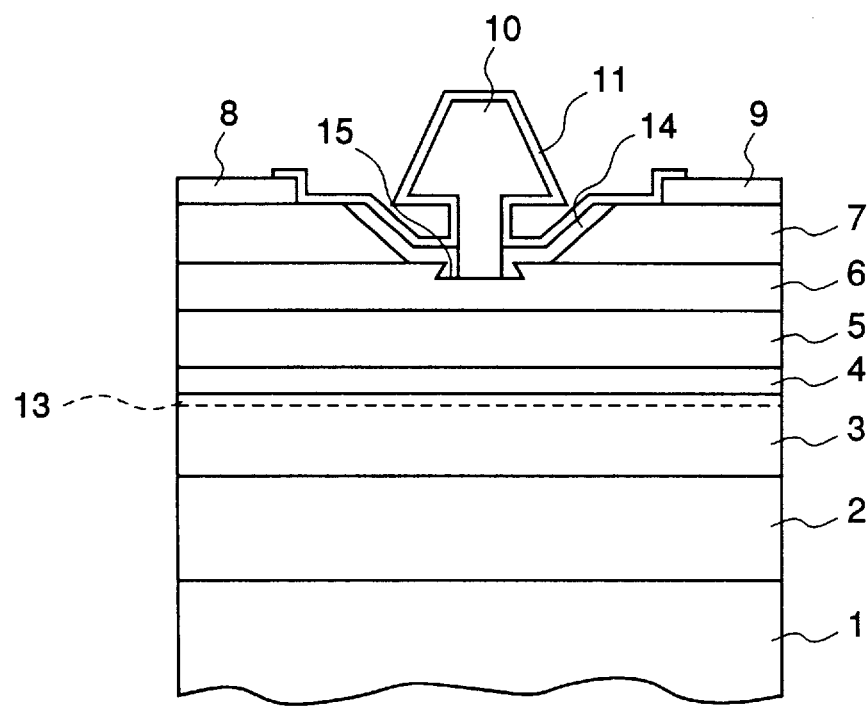
FIG. 1 is a cross-sectional view illustrating a structure of an HEMT according to a first embodiment of the present invention.
Figure 2:
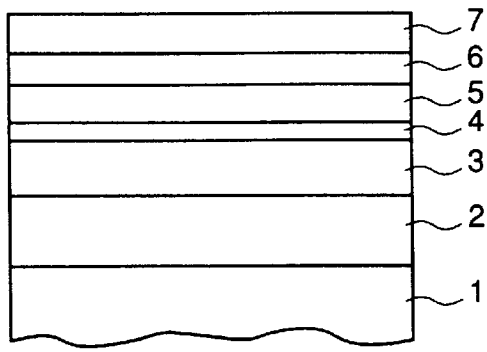
FIGS. 2(a–f) are cross-sectional views illustrating process steps in a method of fabricating an HEMT according to the first embodiment of the present invention.
Figure 2:
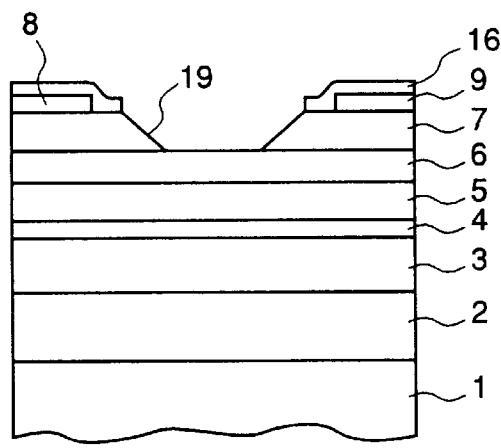
Figure 2:
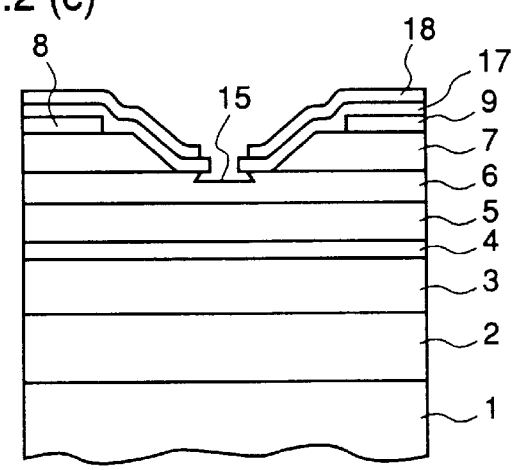
Figure 2:
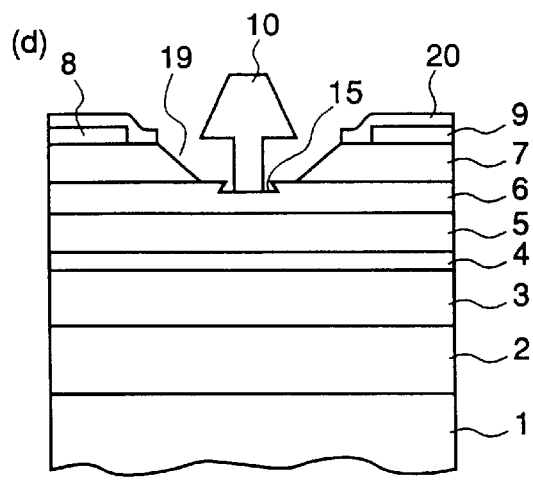
Figure 2:
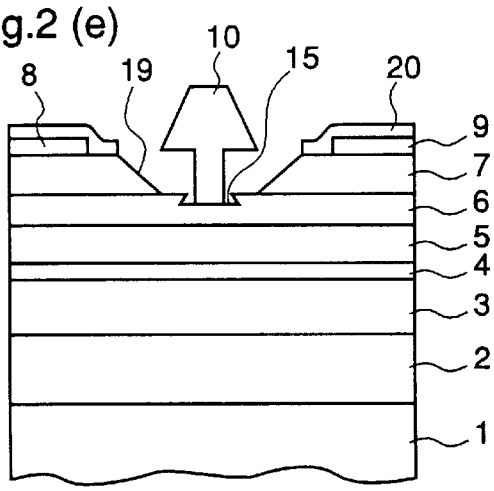
Figure 2:
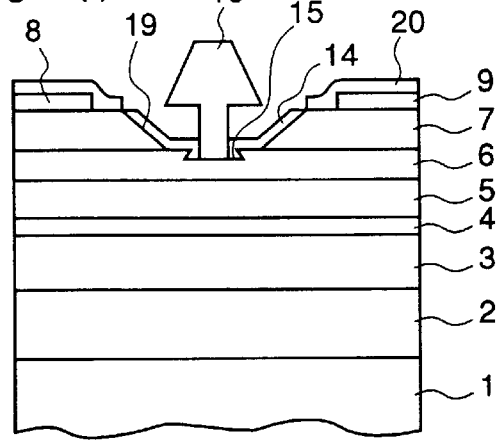

FIG. 1 is a cross-sectional view illustrating a structure of an HEMT according to a first embodiment of the present invention. In the figure, reference numeral 1 designates a semi-insulating InP substrate, numeral 2 designates a high resistance undoped (hereinafter referred to as i-) AlInAs buffer layer disposed on the semi-insulating substrate 1 and having a thickness of about 2500 Å to prevent conduction of current in the substrate 1, numeral 3 designates an i-InGaAs channel layer having a thickness of about 500 Å where electrons travel, numeral 4 designates an i-AlInAs spacer layer having a thickness of about 20 Å, numeral 5 designates an n type (hereinafter referred to as n-) AlInAs electron supply layer having a thickness of about 100 Å with dopant impurities such as Si in a concentration of about $4 \times 10^{18}$ $cm^{-3}$ to supply the channel layer 3 with electrons and numeral 6 designates an i-AlInAs Schottky contact layer having a thickness of about 200 Å. The spacer layer 4 is provided to prevent dopant impurities from invading from the electron supply layer 5. The spacer layer 4 and the Schottky contact layer 6 may be omitted. Numeral 7 designates an n-InGaAs ohmic contact layer having a thickness of about 500 Å with impurities such as Si in a concentration of about $4 \times 10^{18}$ $cm^{-3}$, in ohmic contact with source and drain electrodes, numeral 8 designates the source electrode and numeral 9 designates the drain electrode, which are in ohmic contact with the ohmic contact layer 7. In the first embodiment of the present invention, preferably, refractory metals such as WSi or Mo/Al/Mo are used as electrode materials. Numeral 10 designates a gate electrode to control source to drain current, preferable materials of which are refractory metals such as WSi or Mo/Al/Mo. Numeral 14 designates a surface protection film made of a semiconductor material which does not contain all of Al, In and As to prevent fluorine invasion from a surface of the HEMT, the material of which is InGaP, for example. Other possible materials are InP, InGaAs or InGaAsP. Numeral 11 designates a dielectric protection film made of a dielectric material such as SiON, numeral 15 designates a gate recess and numeral 13 designates a two-dimensional electron gas in the upper portion of the channel layer 3.

FIGS. 2(a)–2(f) are cross-sectional views illustrating process steps in a method of fabricating an HEMT according to the first embodiment of the present invention. In the figure, the same reference numerals as in FIG. 1 designate the same and corresponding parts. Numeral 16 designates a photoresist, numeral 17 designates an EB (Electron Beam) resist, numeral 18 designates a photoresist, numeral 19 designates an opening and numeral 20 designates a mask comprising a dielectric film.

A description will be given of a fabrication method. Initially, as shown in FIG. 2(a), on a semi-insulating InP substrate 1, an undoped AlInAs buffer layer 2, an i-InGaAs channel layer 3, an i-AlInAs spacer layer 4, an n-AlInAs electron supply layer 5, an i-AlInAs Schottky contact layer 6 and an n-InGaAs ohmic contact layer 7 are epitaxially and successively grown by MBE (Molecular Beam Epitaxy) or MOCVD (Metal-Organic Chemical Vapor Deposition).

Next, as shown in FIG. 2(b), source and drain electrodes 8 and 9 are formed on the ohmic contact layer 7 to make ohmic contacts. A region between the source and drain electrodes 8 and 9 of the ohmic contact layer 7 is etched using the photoresist 16 as a mask, to form an opening 19 where the Schottky contact layer 6 is exposed at the bottom surface. Then, after removal of the photoresist 16, again, an EB resist 17 and a photoresist 18 are formed to cover the opening 19. Then a region of the photoresist 18 spaced equally from the source and drain electrodes 8 and 9 is patterned using a conventional exposure process. In addition, a portion of the EB resist 17, which is in the center of the portion patterned by the photoresist 18 is patterned using electron beam exposure (FIG. 2(c)). Then, the i-AlInAs Schottky contact layer 6 exposed at the bottom surface of the opening 19 is etched to form a gate recess 15 using the photoresist 18 and the EB resist 17 as masks. The gate recess may be omitted. Further, after a material of the gate electrode is deposited over the entire surface on the substrate 1 using the photoresist 18 and the EB resist 17 as masks, the material of the gate electrode on the resist 18, 19, as well as the photoresist 18 and the EB resist 17, is lifted off to form a gate electrode 10 in Schottky contact with the Schottky contact layer 6 (FIG. 2(d)).

As described in Japanese Published Patent Application No. Hei 8-83902 and Applied Physics Letters, Vol. 66, No. 7 pp. 863–865, fluorine is adsorbed on an AlInAs surface and this fluorine is removed by vacuum annealing. A dielectric film 20 is formed over the entire surface on the substrate 1. A region on the opening 19 of the dielectric film is selectively etched to form a dielectric mask 20. Thereafter, annealing of an entire semiconductor layer formed on the substrate 1 in vacuum removes fluorine attached to the surface of the i-AlInAs Schottky contact layer 6 (FIG. 2(e)). Preferably, fluorine is removed by the vacuum annealing at a temperature of 400° C., for 10 minutes. Following the vacuum annealing step, a surface protection film 14 is selectively and epitaxially grown on the semiconductor layer comprising the i-AlInAs Schottky contact layer 6 exposed in the opening 19 so that it is not exposed to the atmosphere (FIG. 2(f)). Thereafter, after removal of the dielectric mask 20, the dielectric protection film 11 is deposited by evaporation to cover the exposed semiconductor layer on the substrate 1, completing an HEMT shown in FIG. 1.

A description will be given of operation. Electrons generated from dopant impurities in the electron supply layer 5 move to the channel layer 3 and gather in the upper portion thereof, where a two-dimensional electron gases is formed. The two-dimensional gases serves as a channel, for conduction of current between the source and drain electrodes 8 and 9. At this time, the electron concentration of the two-dimensional electron gas varies in accordance with a gate voltage applied to the gate electrode 10, thereby allowing control of source to drain current. In this HEMT, since the electrons and the dopant impurities are isolated spatially and there are no dopant impurities obstructing electron movement in the portion where the electrons are present, the electrons have high electron mobility.

In the HEMT according to the first embodiment of the present invention, after removal of fluorine, a surface protection film 14 preventing fluorine invasion, made of semiconductor material which does not contain all of Al, In and As is formed only on the surface of the AlInAs Schottky contact layer 6 exposed in the opening 19 for forming the gate electrode 10. As a result, fluorine is prevented from getting into the n-AlInAs electron supply layer 5 from the surface of the AlInAs Schottky contact layer 6, and since there is no surface protection film 14 below the gate electrode 10, the surface of the AlInAs Schottky contact layer 6 can be protected from fluorine with no increase in distance between the gate and the channel, as compared with the case wherein a protection film of InP and InGaP or the like preventing fluorine invasion covers the entire surface of the Schottky contact layer 6 as in the prior art HEMT shown in FIG. 7. Also, since there is no resistance layer between the source and drain electrodes 8 and 9 and the channel layer 3, a source resistance is not increased. As a result, the surface can be protected without adversely affecting device properties. Furthermore, with no deterioration of device properties due to the thickness of the surface protection film 14, the surface protection layer can have a thickness sufficient for protection against fluorine invasion, about several tens of nm in thickness, for example, with no difficulty. Consequently the effectiveness of the surface protection layer is greatly enhanced, whereby reliability of a device is improved. In the prior art HEMT as explained by means of reference 2, after formation of the gate electrode on the Schottky contact layer, following a step of removing fluorine form the surface of the Schottky contact layer, the dielectric protection film is formed without exposing the surface to the atmosphere, plasma CVD to form the dielectric protection film damages the surface of the Schottky contact layer, so that device properties are deteriorated. However, in the first embodiment of the present invention, since the surface protection film is formed by crystal regrowth using MOCVD or CBE, there arises no such problem and device properties are not deteriorated. Further, in the first embodiment of the present invention, the surface protection film is only on the portion of the Schottky contact layer which is exposed when a gate electrode is formed, and not over all of the surface of the substrate 1. As a result, there is no problem of the substrate being bent, or undesired stresses being applied by the surface protection film, resulting in an HEMT of good quality.

Thus, according to the first embodiment of the present invention, the fabrication process is as follows. The opening 19 is formed in the ohmic contact layer 7 and the gate electrode 10 is formed on the Schottky contact layer 6 exposed at the bottom surface of the opening 19. Thereafter, fluorine in the exposed portion of the Schottky contact layer 6 is removed. Subsequently, the surface protection film 14 made of a semiconductor material which does not contain any of Al, In, and As is selectively grown on the exposed portion of the Schottky contact layer 6. Therefore, device properties are not deteriorated, resulting in an HEMT with improved reliability.

In the HEMT according to the first embodiment of the present invention, Si doped AlInAs is used as the electron supply layer 5. Instead of providing the electron supply layer 5, a planar doped layer containing dopant impurities such as Si, planar doped with some atomic thickness, may be provided between the i-AlInAs spacer layer 4 and the i-AlInAs Schottky contact layer 6, the vicinity of which may be used as the electron supply layer 5. In this case, the same effects as described in the first embodiment are attained. In addition, a two-dimensional electron gas concentration higher than that of the HEMT described as the first embodiment is obtained, the source resistance Rs is reduced, and the transconductance gm is improved.

In the first embodiment, when forming the surface protection film, a crystal growth method permitting selective growth is necessary. The method includes MOCVD, CBE (Chemical Beam Epitaxy), and ALE (Atomic Layer Epitaxy), for example. Among these methods, CBE and ALE can obtain a high selectively at relatively low temperatures (600° C. or less). Especially since portions of ohmic and gate electrodes of a device tend to deteriorate due to heat, CBE and ALE have some advantages in realizing a stable device. Further, in the first embodiment, the surface protection film is formed after formation of the gate electrode 10, and, especially in the case of using a T-shaped gate, it is difficult to selectively grow a portion where the T-shaped gate is overlying and to perform a good crystal growth using MOCVD. However, a very good crystal growth can be achieved in the portion concerned when ALE is applied.

[Embodiment 2]

Figure 3:
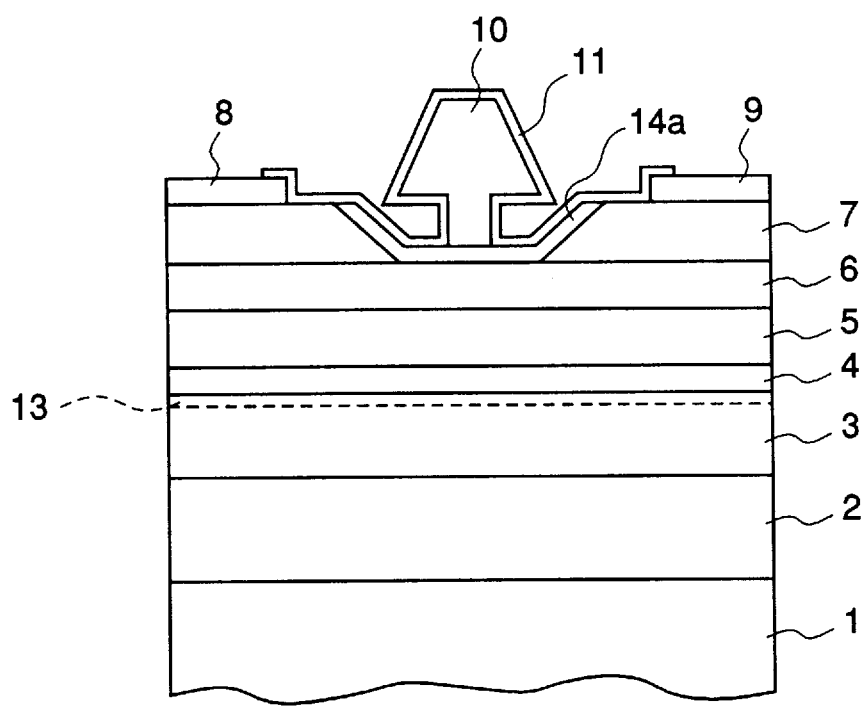
FIG. 3 is a cross-sectional view illustrating a structure of an HEMT according to a second embodiment of the present invention.

FIG. 3 is a cross-sectional view illustrating a structure of an HEMT according to the second embodiment of the present invention. In the figure, the same reference characters as in FIG. 1 designate the same or corresponding parts. Reference character 14a designates a surface protection film made of a semiconductor material which does not contain all of Al, In, and As, such as InP, InGaP, InGaAs or InGaAsP, for example, to prevent fluorine invasion from the surface of the HEMT.

Figure 4:
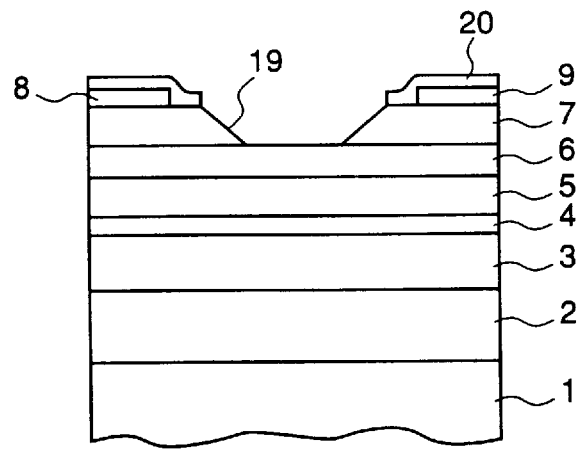
FIGS. 4(a–c) are cross-sectional views illustrating process steps in a method of fabricating an HEMT according to the second embodiment of the present invention.
Figure 4:
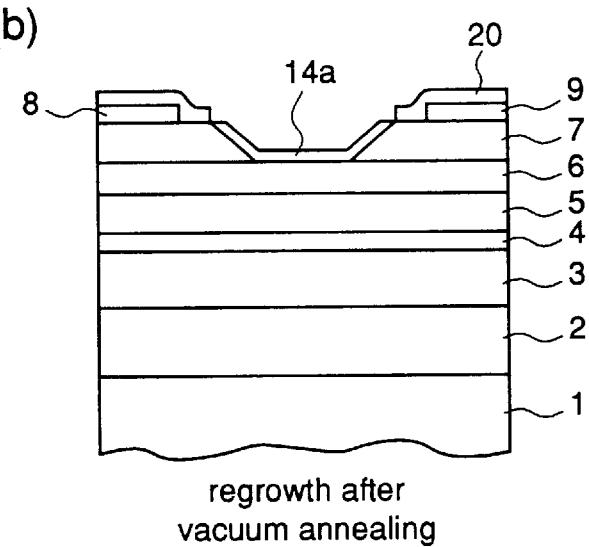
Figure 4:
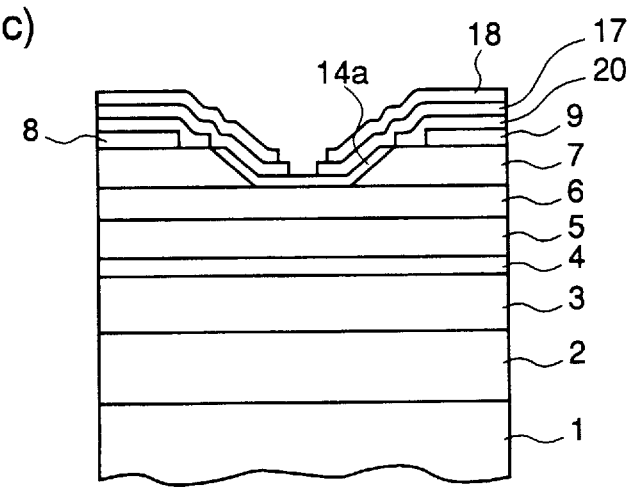

FIGS. 4(a)–4(c) are cross-sectional views illustrating process steps in a method of fabricating the HEMT according to the second embodiment of the present embodiment. The same reference characters as in FIG. 2 and FIG. 3 designate the same or corresponding parts.

The HEMT according to the second embodiment differs from the HEMT according to the first embodiment in that, after formation of the surface protection film 14a on the Schottky contact layer exposed at the bottom surface of the opening in the ohmic contact layer, the gate electrode is formed on the surface protection film 14a, rather than after formation of the gate electrode, the surface protection film is formed on the exposed Schottky contact layer.

A description will be given of a fabrication method. Like the steps shown in FIGS. 2(a), 2(b) with respect to the first embodiment, initially, the buffer layer 2, the channel layer 3, the spacer layer 4, the electron supply layer 5, the Schottky contact layer 6 and the ohmic contact layer 7 are epitaxially and successively grown on the semi-insulating InP substrate 1, by MBE or MOCVD. The source and drain electrodes 8 and 9 are formed on the ohmic contact layer 7. The region between the source and drain electrodes 8 and 9 of the ohmic contact layer 7 is etched using the photoresist 16 as a mask to form the opening 19, which has exposes the Schottky contact layer 6 at the bottom surface. Next, after removal of the photoresist 16, as shown in FIG. 4(a), the dielectric film is formed over the entire surface on the substrate 1 and a region on the opening 19 of the dielectric film is selectively removed to form the dielectric mask 20. Then fluorine on the surface of the Schottky contact layer 6 in the opening 19 is removed by vacuum annealing of the substrate 1 and the surface protection film 14a is selectively and epitaxially grown on the Schottky contact layer 6 exposed in the opening 19 using the dielectric mask 20 without exposure to the atmosphere as in the first embodiment.

Thereafter, the EB resist 17 and the photoresist 18 are formed to cover the opening. The region of the photoresist 18 spaced equally from the source and drain electrodes 8 and 9 is patterned using usual exposure. Further, a portion of the EB resist 17, which is in the center of the portion patterned by the photoresist 18 is patterned using electron beam exposure (FIG. 4(c)). Using these as masks, the gate electrode 10 is formed in Schottky contact with the surface protection film 14 by a vacuum evaporation and lift off technique. After removal of the photoresist 18, the EB resist 17 and the dielectric mask 20, the dielectric protection film 11 is formed in the exposed portion of the semiconductor layers on the substrate, completing the HEMT shown in FIG. 3.

In the HEMT according to the second embodiment, after removal of fluorine, the surface protection film 14a preventing fluorine invasion is formed on the exposed portion of the Schottky contact layer 6, so that device properties are not deteriorated due to fluorine invasion.

Figure 7:
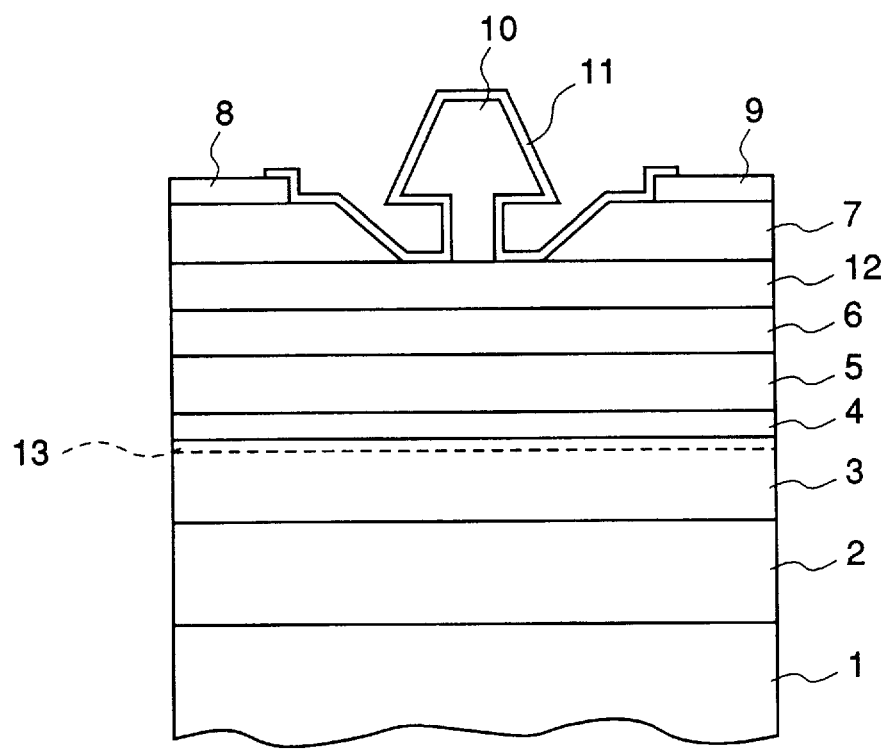
FIG. 7 is a cross-sectional view illustrating a structure of another prior art HEMT.

Unlike the prior art HEMT shown in FIG. 7, the surface protection film 14a is not formed between the source and drain electrodes 8 and 9 and the channel layer 3, so that the distance between the gate and the channel is not increased and the source resistance Rs is not increased. As a result, device properties are not deteriorated.

The surface protection film 14a is selectively formed by crystal regrowth, the surface of the Schottky contact layer 6, which is a regrowth interface, is less damaged and the surface protection film 14a can be formed only in a required position. As a result, device properties and device qualities are not adversely affected.

In the second embodiment, the gate electrode 10 is formed after the vacuum annealing for removing fluorine and formation of the surface protection film 14a, so that a gate with a high heat stability is unnecessary. Therefore the degree of freedom in designing is increased as compared with the first embodiment.

Since the surface protection film 14a is planar, control of growth can be simplified as compared with the case wherein the surface protection film is grown to embed the surroundings of the gate electrode as in the first embodiment.

Since the surface protection film 14a is formed before formation of the gate electrode 10, heat resistance of the gate metal is not a consideration, when selectively growing the surface protection film 14a. As a result, the degree of freedom in setting growth temperatures is increased.

Thus, in the second embodiment, the opening 19 is formed in the ohmic contact layer 7. Fluorine on the surface of the Schottky contact layer 6 exposed at the bottom surface of the opening 19 is removed by vacuum annealing. Subsequently to this, after the surface protection film 14a made of the semiconductor material which does not contain all of Al, In, and As is selectively grown on the exposed portion of the Schottky contact layer 6, and the gate electrode 10 is formed thereon. Therefore, the same effects as described in embodiment 1 are attained. In addition, the degree of freedom in process design is increased and the fabrication process can be simplified.

[Embodiment 3]

Figure 5:
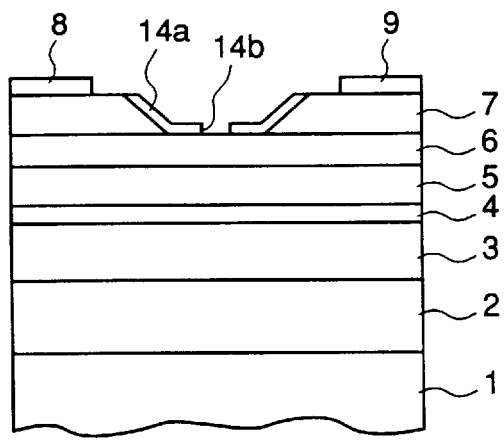
FIGS. 5(a) and 5(b) are cross-sectional views illustrating main steps in a method of fabricating an HEMT according to the second embodiment of the present invention.
Figure 5:
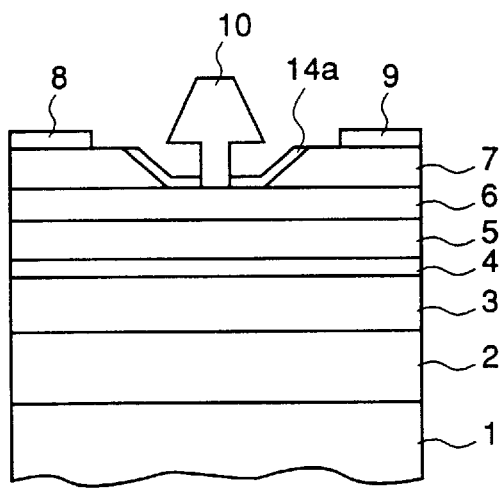
Figure 6:
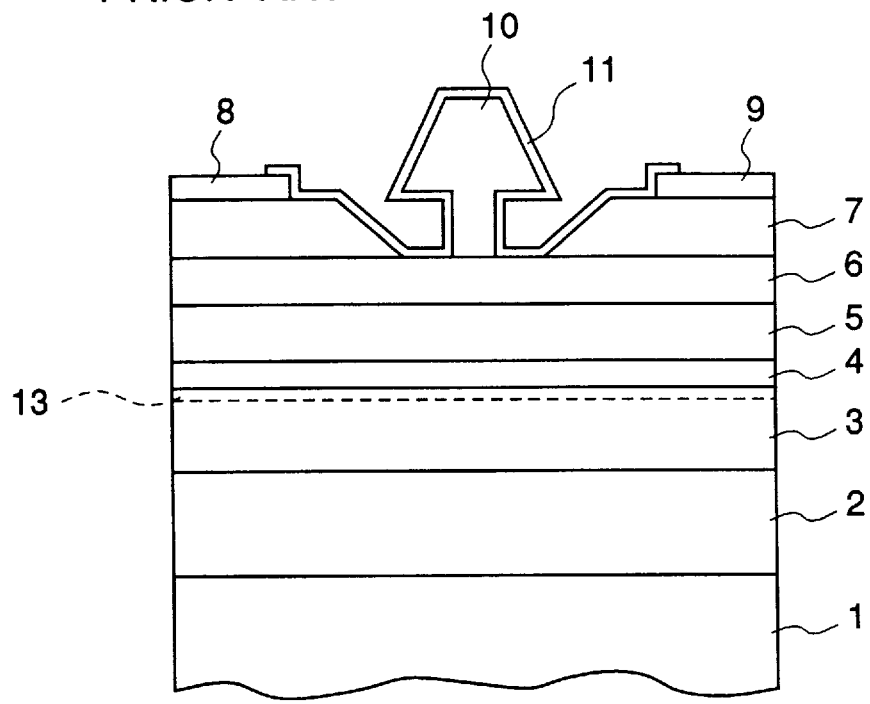
FIG. 6 is a cross-sectional view illustrating a structure of a prior art HEMT.

FIGS. 5(a) and 5(b) are cross-sectional views illustrating steps in a method of fabricating an HEMT according to the third embodiment. In the figure, the same reference characters as in FIG. 4 designate the same and corresponding parts. Character 14b designates an opening formed in a region where a gate electrode is to be formed in a surface protection film 14a.

In this third embodiment 3, the opening 19 is formed in a region between source and drain electrodes 8 and 9 of an ohmic contact layer 7 as in the second embodiment. After vacuum annealing, the surface protection film 14a preventing fluorine invasion, made of a semiconductor material which does not contain all of Al, In, and As is selectively and epitaxially grown on the Schottky contact layer 6 exposed in the opening 19 as in the second embodiment. As shown in FIG. 4(b), the surface protection film 14a is selectively grown in the opening 19 of the ohmic contact layer 7. Thereafter, as shown in FIG. 5(a), a second opening 14b reaching the Schottky contact layer 6 is formed where the gate electrode is to be formed, in the protection film 14a. After another vacuum annealing of the surface of the second opening 14b for removal of fluorine, as shown in FIG. 5(b), the gate electrode 10 is formed to fill the second opening 14b, with the surface of the Schottky contact layer 6 in the second opening 14b not exposed to the atmosphere.

In the HEMT according to the third embodiment, the fabrication process is as follows. After vacuum annealing, the surface protection film 14a is formed in the opening 19 of the ohmic contact layer 7. After formation of the second opening 14b in the surface protection film 14a and vacuum annealing, the gate electrode 10 is formed. Therefore, the gate electrode 10 is formed after formation of the surface protection film and the degree of freedom in growth conditions for selective growth is increased, so that the same effects as described in the second embodiment are attained. Further, there exists no surface protection film 14a below the gate electrode 10, whereby transconductance gm is reduced and an HEMT with good properties is obtained.

The embodiments described are HEMTS, however, the present invention applies to other field effect transistors. In these cases, the same effects as described are attained.

What is claimed is:

1. A field effect transistor comprising:
    a semi-insulating III-V compound semiconductor substrate;
    a channel layer disposed on the substrate;
    an n type electron supply layer disposed on the channel layer, comprising a crystalline compound semiconductor layer including AlAs and InAs, and containing dopant impurities;
    an n type ohmic contact layer disposed on the electron supply layer and including the dopant impurities in a higher concentration than in the electron supply layer;
    source and drain electrodes disposed on the ohmic contact layer and making ohmic contacts;
    an opening penetrating through the ohmic contact layer to the electron supply layer in a region between the source and drain electrodes;
    a gate electrode disposed in the opening and making a Schottky contact; and
    an epitaxial III-V compound semiconductor surface protection film, containing no more than two of Al, In, and As, covering the ohmic contact layer and the electron supply layer in the opening except where the gate electrode is present.

2. The field effect transistor of claim 1 including a gate recess in the electron supply layer in the opening wherein the gate electrode is disposed in the gate recess.

3. The field effect transistor of claim 1 including a Schottky layer interposed between the electron supply and ohmic contact layers, the gate electrode forming a Schottky contact to the Schottky layer.

4. The field effect transistor of claim 1 including a dielectric protection film disposed on and covering the gate electrode and the surface protection film.

5. The field effect transistor of claim 1 wherein the surface protection film is InGaP.

6. The field effect transistor of claim 1 wherein the surface protection film is InP.

7. The field effect transistor of claim 1 wherein the surface protection film is InGaAs.

8. The field effect transistor of claim 1 wherein the surface protection film is InGaAsP.

9. The field effect transistor of claim 1 wherein the III-V compound semiconductor substrate is InP.

10. A field effect transistor comprising:
    a semi-insulating III-V compound semiconductor substrate;
    a channel layer disposed on the substrate;
    an n type electron supply layer disposed on the channel layer, including AlAs and InAs, and containing dopant impurities;
    an n type ohmic contact layer disposed on the electron supply layer and including the dopant impurities in a higher concentration than in the electron supply layer;
    source and drain electrodes disposed on the ohmic contact layer and making ohmic contacts;
    an opening penetrating through the ohmic contact layer to the electron supply layer in a region between the source and drain electrodes;
    an epitaxial III-V compound semiconductor surface protection film, containing no more than two of Al, In, and As, covering the ohmic contact layer and the electron supply layer in the opening; and
    a gate electrode disposed on a region of the surface protection film opposite the electron supply layer and making a Shottky contact.

11. The field effect transistor of claim 10 including a Schottky layer interposed between the electron supply and ohmic contact layers.

12. The field effect transistor of claim 10 including a dielectric protection film disposed on and covering the gate electrode and the surface protection film. Schottky contact.

13. The field effect transistor of claim 10 wherein the III-V compound semiconductor substrate is InP.

14. The field effect transistor of claim 10 wherein the surface protection film is InGaP.

15. The field effect transistor of claim 10 wherein the surface protection film is InP.

16. The field effect transistor of claim 10 wherein the surface protection film is InGaAs.

17. The field effect transistor of claim 10 wherein the surface protection film InGaAsP.

* * * * *

UNITED STATES PATENT AND TRADEMARK OFFICE
CERTIFICATE OF CORRECTION

PATENT NO.   : 5,811,843
DATED        : September 22, 1998
INVENTOR(S)  : Yamamoto et al.

It is certified that error appears in the above-identified patent and that said Letters Patent is hereby corrected as shown below:

Column 12, Line 55, delete "Schottky contact.".

Signed and Sealed this

Eighth Day of June, 1999

Attest:

Q. TODD DICKINSON

*Attesting Officer*    *Acting Commissioner of Patents and Trademarks*